(12) United States Patent
Klein

(10) Patent No.: US 8,890,519 B2
(45) Date of Patent: Nov. 18, 2014

(54) PRINTED CIRCUIT BOARD COMPRISING TWO COILS

(75) Inventor: Philippe Klein, Saint Pierre d'Allevard (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 201 days.

(21) Appl. No.: 13/606,486

(22) Filed: Sep. 7, 2012

(65) Prior Publication Data

US 2013/0057276 A1 Mar. 7, 2013

(30) Foreign Application Priority Data

Sep. 7, 2011 (FR) ...................................... 11 57934

(51) Int. Cl.
| | | |
|---|---|---|
| *G01R 33/00* | (2006.01) | |
| *G01R 33/02* | (2006.01) | |
| *H01F 27/28* | (2006.01) | |
| *H01F 5/00* | (2006.01) | |
| *G01R 33/04* | (2006.01) | |
| *G01R 33/05* | (2006.01) | |
| *H05K 1/16* | (2006.01) | |
| *H02K 3/26* | (2006.01) | |
| *H05K 3/46* | (2006.01) | |
| *H05K 1/02* | (2006.01) | |
| *H02K 35/02* | (2006.01) | |

(52) U.S. Cl.
CPC ............... *H05K 1/165* (2013.01); *G01R 33/04* (2013.01); *G01R 33/05* (2013.01); *H01F 5/003* (2013.01); *H05K 3/46* (2013.01); *G01R 33/0052* (2013.01); *H05K 1/0239* (2013.01); *G01R 33/045* (2013.01); *H05K 2201/09263* (2013.01); *H02K 3/26* (2013.01); *H05K 2201/09672* (2013.01); *H02K 35/02* (2013.01); *H05K 2201/086* (2013.01); *H05K 2201/097* (2013.01)
USPC ........... 324/260; 324/258; 336/184; 336/188; 336/189; 336/200; 336/226

(58) Field of Classification Search
USPC ........................................................ 324/260
See application file for complete search history.

(56) References Cited

U.S. PATENT DOCUMENTS

| | | | |
|---|---|---|---|
| 4,080,585 | A | 3/1978 | Molthen |
| 5,245,307 | A | 9/1993 | Klaus et al. |
| 6,914,508 | B2 | 7/2005 | Ferencz et al. |
| 7,187,263 | B2 | 3/2007 | Vinciarelli |
| 7,372,261 | B2 | 5/2008 | Choi et al. |
| 7,511,591 | B2 | 3/2009 | Ezzendine |
| 8,089,331 | B2 | 1/2012 | Jacobson et al. |
| 2002/0057171 | A1 | 5/2002 | Patel et al. |
| 2006/0001422 | A1 | 1/2006 | Kang et al. |
| 2006/0087384 | A1 | 4/2006 | Ezzendine |
| 2008/0048814 | A1 | 2/2008 | Weger |
| 2009/0066461 | A1 | 3/2009 | Ezzeddine |
| 2010/0007358 | A1 | 1/2010 | Schaerrer et al. |
| 2011/0210722 | A1 | 9/2011 | Paci et al. |
| 2013/0057276 | A1 | 3/2013 | Klein |
| 2013/0057372 | A1 | 3/2013 | Klein |

FOREIGN PATENT DOCUMENTS

| | | |
|---|---|---|
| EP | 0917163 | 5/1999 |
| EP | 1168387 | 1/2002 |
| FR | 2877163 | 4/2006 |
| FR | 2379229 | 10/2011 |
| GB | 2265013 | 9/1993 |
| GB | 2339294 | 1/2000 |
| WO | 01/44826 | 6/2001 |
| WO | 2009/016198 | 2/2009 |

*Primary Examiner* — Bot Ledynh
(74) *Attorney, Agent, or Firm* — Occhiuti & Rohlicek LLP

(57) ABSTRACT

A printed circuit in which, in going from one end to another, a same conductive line is wound successively: around the first winding axis to form at least one half-turn of a first coil, then around the second winding axis to form at least one half-turn of a second coil, then around the first winding axis to form at least one half-turn of a first coil, then around the second winding axis to form at least one half-turn of a second coil.

9 Claims, 4 Drawing Sheets

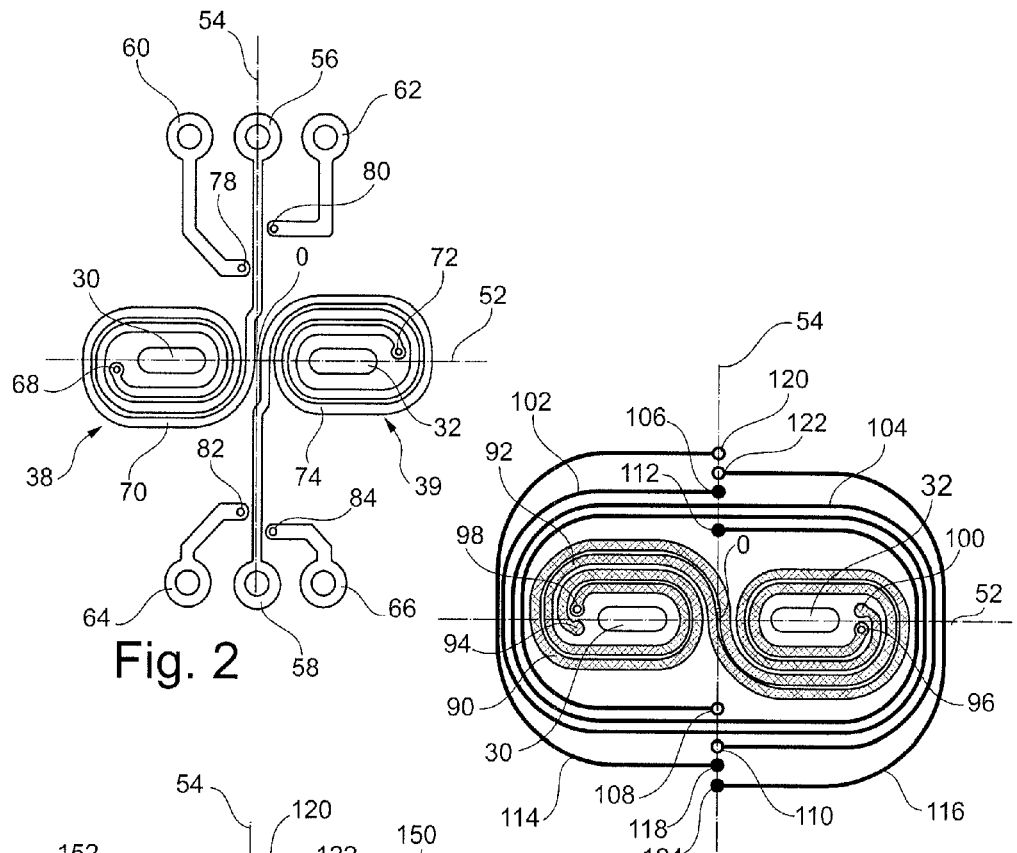
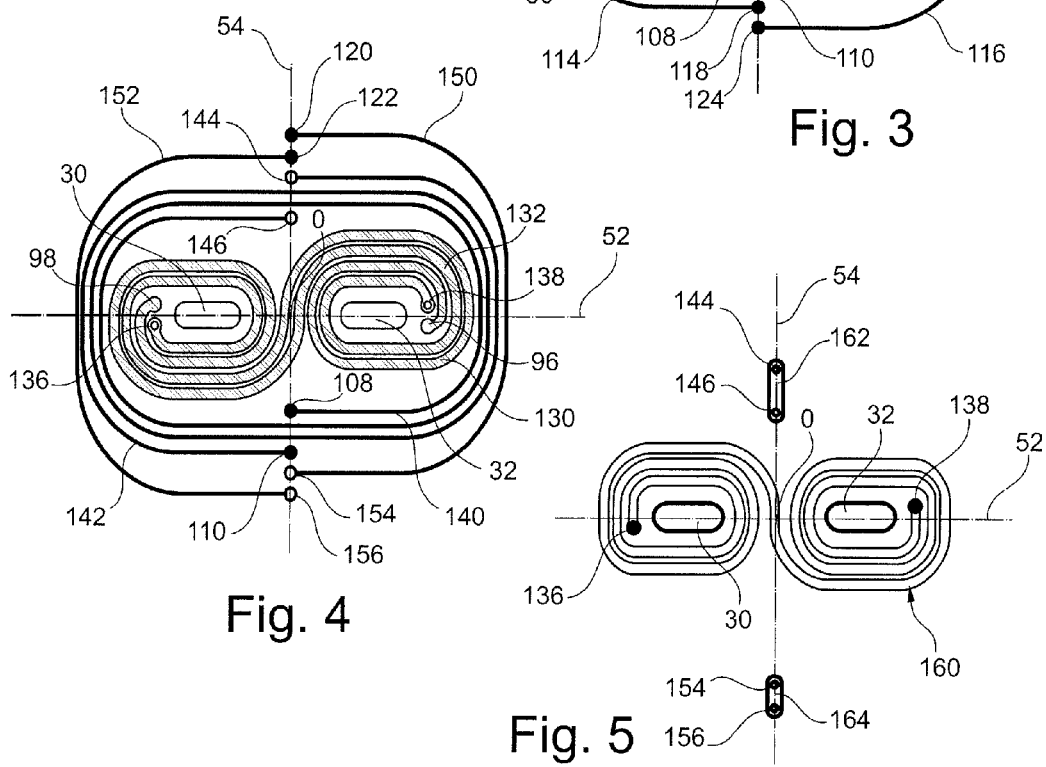

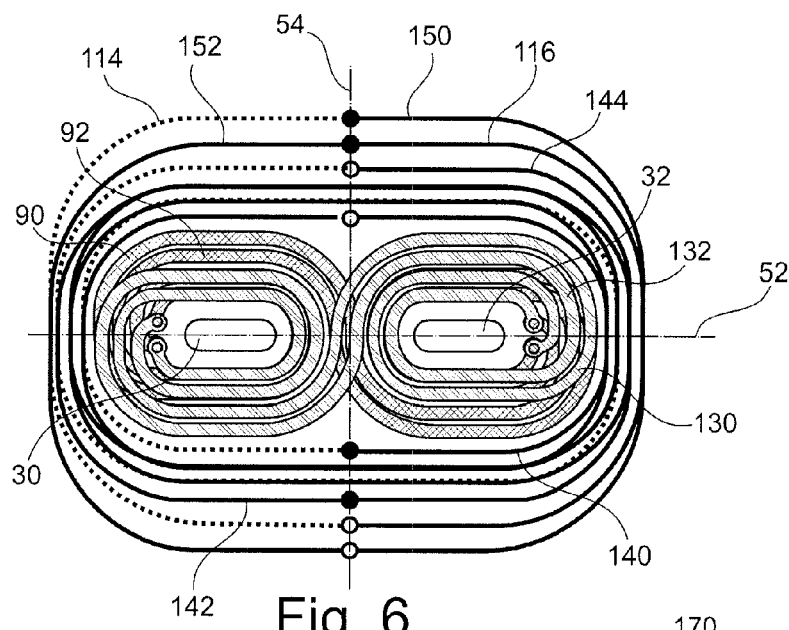
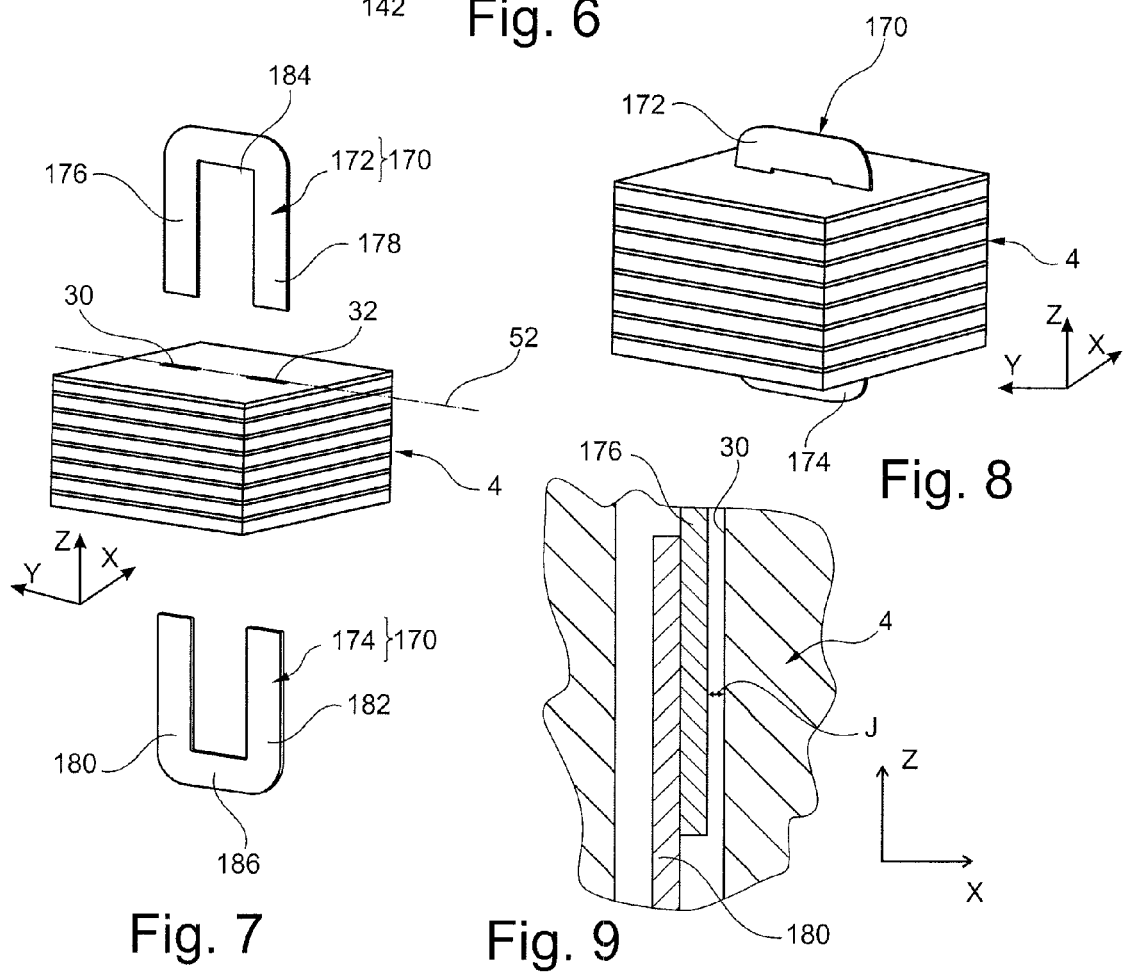
Fig. 6
Fig. 7
Fig. 8
Fig. 9

PRINTED CIRCUIT BOARD COMPRISING TWO COILS

RELATED APPLICATIONS

Under 35 USC 119, this application claims the benefit of the priority date of French application FR 1,157,934, filed on Sep. 7, 2011, the contents of which are herein incorporated by reference.

FIELD OF INVENTION

The invention pertains to a printed circuit board, a magnetic field sensor and an alternating voltage generator.

BACKGROUND

A printed circuit board or PCB is a carrier used for the electrical connection of a set of electrical components. Such a printed circuit board generally takes the form of a stratified or laminated plate. This printed circuit board may be a single-layer or multilayer printed circuit board. A single-layer printed circuit board has only one metallization layer in which there are printed conductive tracks that electrically connect the different electrical components to one another. A multilayer printed circuit board on the contrary has several metallization layers, i.e. at least two layers and, preferably, more than four or six layers. The description here below shall be concerned chiefly with these multilayer printed circuit boards.

A metallization layer is one of the layers of the stratified plate forming the printed circuit board in which one or more conductive tracks are made, electrically connecting the different electrical components to one another. This layer is flat and extends in parallel to the plane of the stratified plate. Generally, the metallization layer is obtained by depositing a uniform layer of a conductive material, typically a metal such as copper, and then etching this uniform layer to allow only the conductive tracks to remain.

The different metallization layers of the printed circuit board are mechanically spaced out from one another by insulating layers made of an electrically insulating material. This insulating material has high dielectric rigidity, i.e. typically greater than 3 MV/m and preferably greater than 10 MV/m. For example, the electrically insulating material is made of epoxy resin and/or fiberglass. The insulating layer generally takes the form of a rigid plate made of a material that does not become viscous when it is joined with other layers. For example, it is made of a thermosetting resin which has already undergone irreversible thermosetting.

The different layers of the multilayer printed circuit board are joined to one another without any degree of freedom by means of adhesive layers known as "pre-impregnated" layers and more generally known as "prepreg" layers.

A pre-impregnated layer is constituted by a thermosetting resin impregnating, generally, a reinforcing element such as a fabric. Typically, the resin is an epoxy resin. During the manufacturing of the printed circuit board, the transformation of the thermosetting resin brings into play an irreversible polymerization which converts the pre-impregnated material into a solid and rigid material which irreversibly bonds together the different layers of the printed circuit board. Typically, each transformation takes place when the pre-impregnated layer is heated to a high temperature and is compressed with high pressure. Here, a high temperature is a temperature above 100° C. and preferably above 150° C. A high pressure is a pressure greater than 0.3 MPa and typically greater than 1 MPa.

The conductive tracks of the different metallization layers can be electrically connected by means of conductive pads passing through the insulating layers. The conductive pads are more generally known as "vias". The vias generally extend perpendicularly to the plane of the layers. There are different ways of making these vias. One of the most common ways is to make a hole in the insulating layer or layers to be crossed and then to coat the inner wall of these holes with a metal. They are then referred to as metallized holes.

A via does not necessarily pass through all the layers of the printed circuit board. Thus, there are blind holes which open into only one external face of the printed circuit board. At present, it is also possible to make "buried" vias for example by means of known technologies such as HDI (High Density of Integration) technologies. A buried via does not open into any of the external faces of the printed circuit board. For example, a buried via electrically connects conductive tracks made in metallization layers buried within the printed circuit board.

Known printed circuit boards comprise a stack, along a vertical direction, of several metallization layers mechanically separated from one another by electrically insulating layers, at least one first and one second coil series-connected to each other, these first and second coils being wound respectively around a first and a second winding axes, the turns of each of these coils being formed by conductive tracks made in the metallization layers and electrically connected to one another by pads passing through at least one of the electrically isolating layers, the joining of these conductive tracks and of these through pads forming one and the same conductive line which extends continuously from one end of the first coil to an opposite end of the second coil.

It is frequent to have coils series-connected in magnetic field sensors such as fluxgate sensors. In this case, the coils correspond to excitation coils wound around respective magnetic bars or around respective branches of a magnetic ring.

In known printed circuit boards, the making of the first and second coils requires four vias between each metallization layer stacked one top of the other. Furthermore, it is also necessary to have four connection pads to power these two coils.

Prior art is also known from GB 2,339,294, U.S. 2006/001, 422 A1, and GB 2,265,013 A.

SUMMARY

The invention is aimed at simplifying the manufacture of these coils and of the printed circuit board in which they are made.

In this printed circuit board, the number of vias needed to make the first and second coils is reduced. Indeed, in the first and second metallization layers, it is the same track that is used to form the turns of the first and second coils. This conductive track needs only two vias to be connected to the other conductive tracks made in the other metallization layers. Furthermore, to supply these two coils, it is enough simply to have two connection pads rather than the four used in the prior-art embodiment.

The embodiments of this printed circuit board may comprise one or more of the characteristics of the dependent claims.

The embodiments of this printed circuit board furthermore have the following advantages:

the making of each coil by means of downward coil and an upward coil enables each coil to be supplied from connection pads situated on a same side of the printed circuit board;

the existence of axial symmetries in the superimposition of the conductive tracks of the first and second coils limits the size of the bias which may appear in the magnetic field generated or measured by these coils as compared with an ideal coil, the fact that these conductive tracks also have a central symmetry increases the homogeneity of the magnetic field along the winding axis.

An object of the invention is also a magnetic field sensor comprising:

a magnetic core comprising two parallel arms, at least two coils each wound around a respective arm of the magnetic core, the above printed circuit board in which the two coils of the printed circuit board form the two coils of the sensor.

An object of the invention is also an alternating voltage generator.

BRIEF DESCRIPTION OF THE DRAWINGS

The invention shall be understood more clearly from the following description given purely by way of a non-restrictive example and made with reference to the appended drawings of which:

FIGS. 2 to 5 are illustrations of the conductive tracks etched in different metallization layers to make coils of the sensor of FIG. 1, FIG. 6 is an illustration of a superimposition in a plane of the conductive tracks illustrated in FIGS. 3 and 4, FIGS. 7 and 8 are schematic illustrations in perspective of a coiled magnetic ring used in the sensor of FIG. 1, in exploded and assembled views respectively, FIG. 9 is a schematic illustration of a detail of the wound magnetic ring of FIGS. 7 and 8.

DETAILED DESCRIPTION

In these figures, the same references are used to designate the same elements.

Here below in this description, the characteristics and functions well known to those skilled in the art are not described in detail.

Figure 1:
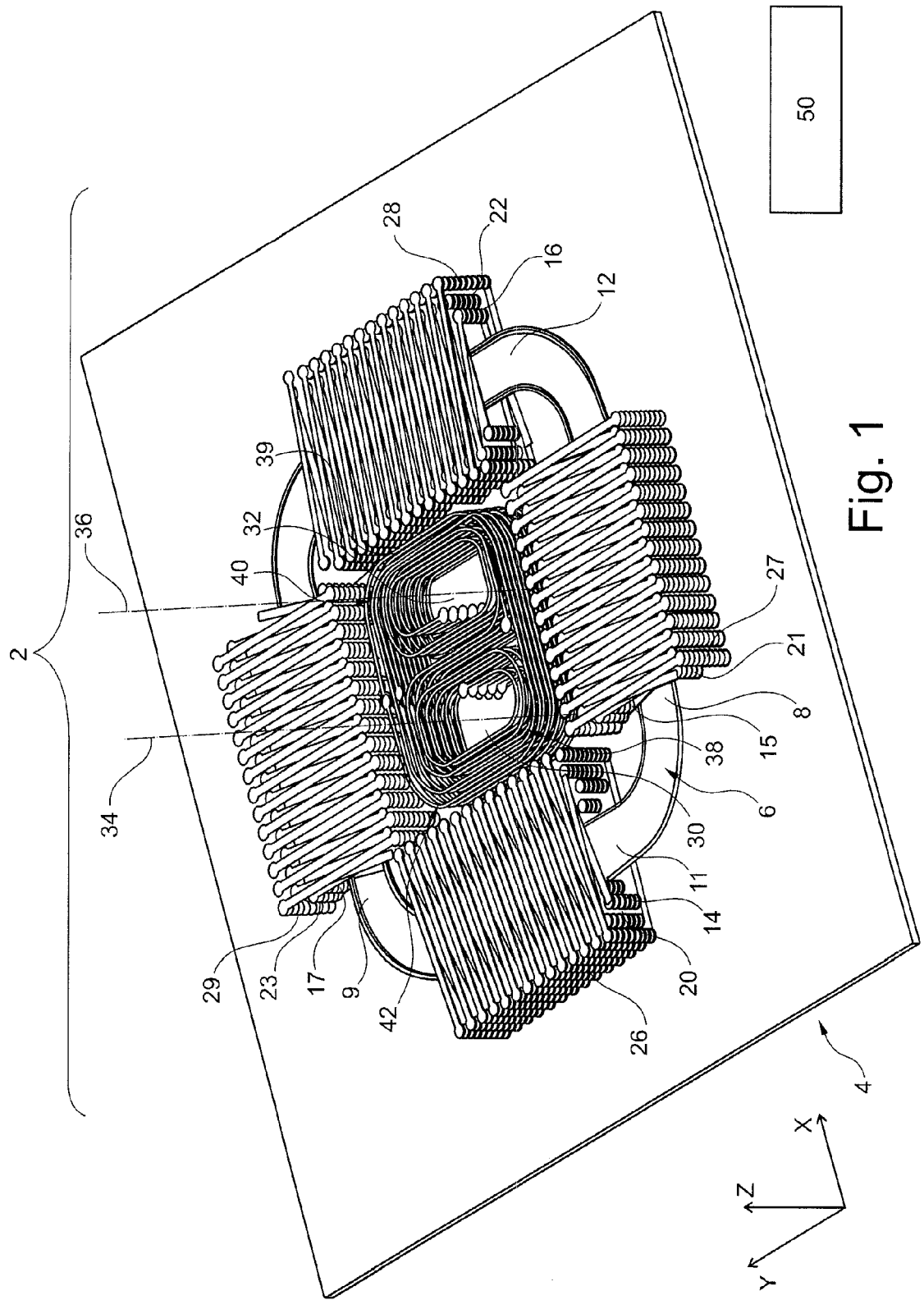
FIG. 1 is a schematic view in perspective of a magnetic field sensor.

FIG. 1 shows a fluxgate sensor 2. This sensor 2 is capable of measuring the orientation and, if necessary, the intensity of an external magnetic field T. More specifically, the sensor 2 measures the components $T_X$, $T_Y$ and $T_Z$ corresponding respectively to the projections of the magnetic field T in three non-collinear directions X, Y and Z. Here, the directions X, Y and Z are mutually orthogonal. The direction Z is the vertical direction and the directions X and Y define a horizontal plane.

Fluxgate sensors are well known. Reference could be made for example to the U.S. Pat. No. 7,372,261 for their functioning. Consequently, in this description, only those features that are needed to understand the invention are described in detail.

The sensor 2 has a multilayered printed circuit board 4. Typically, the printed circuit board 4 has more than two or five metallization layers and preferably more than ten metallization layers. Here, it has ten metallization layers. To simplify FIG. 1, only one layer of the circuit 4 has been illustrated. The metallization layers are stacked on top of one another in the direction Z. The topmost metallization layer in the direction Z corresponds to the upper face while the bottommost metallization layer corresponds to the lower face of the printed circuit board.

The printed circuit board 4 has a magnetic ring 6 housed in a horizontal annular cavity. The ring 6 is situated between the upper and lower faces of the printed circuit board. It is typically made out of a magnetic material, of which the static relative permeability, i.e. the permeability at zero frequency, is greater than 1000 and preferably greater than 10000. For example, the magnetic material is a mu-metal or a magnetic metal commercially known as VITROVAC® 6025.

Here, the ring 6 is manufactured independently of the printed circuit board 4 and then inserted into the cavity during the manufacture of the printed circuit board. To this end, the transverse dimensions of the ring 6, i.e. in this case the dimensions of the ring in the vertical plane, are smaller by at least 5 μm and preferably by at least 100 μm than the corresponding transverse dimensions of the cavity. There is therefore a clearance between the walls of the cavity and the facing faces of the ring 6. As a result of this clearance, the magnetic ring is not mechanically stressed by the printed circuit board 4. This especially increases the precision of the sensor 2 because any mechanical stress exerted on the ring 6 modifies its magnetic properties by magnetostriction and therefore gives rise to disturbances in the measured magnetic field T.

Here, the ring 6 has two bars 8 and 9 parallel to the direction X and two magnetic bars 11 and 12 parallel to the direction Y. The ends of these bars are connected to one another by corners made of magnetic material to form the ring 6.

To saturate the magnetic ring 6, four excitation coils 14 to 17 are made in the printed circuit board 4. These excitation coils are crossed by a same excitation current $i_{exH}$ at an excitation frequency $f_{exH}$. Typically, the excitation coil $f_{exH}$ is greater than 300 Hz and preferably greater than 10 kHz. Here, the coils 14 to 17 are wound respectively around the bars 11, 8, 12 and 9.

The coils 14 to 17 are series-connected to one another so as to generate a magnetic excitation field $B_{exH}$ in the same sense when they are crossed by the current $i_{exH}$. Each coil 14 to 17 is formed by conductive tracks made in two metallization layers of the printed circuit board situated respectively above and below the magnetic ring 6. The ends of the conductive tracks are connected to one another by vertical vias to form the turns of the coils 14 to 17. Such an embodiment of coils extending along a horizontal axis is for example described in the patent application WO 2008/016198.

The printed circuit board 4 also has four measurement coils 20 to 23 wound respectively around the bars 11, 8, 12 and 9 to measure the magnetic field within these bars. The measurements of the magnetic field made by each of these coils 20 to 23 are respectively denoted as $M_1$, $M_2$, $M_3$ and $M_4$. Here, the measurements are given by the following relationships:

$M_1 = T_Y - B_{exH}$,
$M_2 = T_X + B_{exH}$,
$M_3 = T_Y + B_{exH}$, and
$M_4 = T_X - B_{exH}$.

These relationships are given with the following conventions:
- the excitation magnetic field $B_{exH}$ rotates in the counter-clockwise sense, and
- the components $T_X$ and $T_Y$ are directed in the same direction as the directions X, Y respectively.

Here, the coils 20 to 23 are wound around excitation coils 14 to 17 respectively. These coils 20 to 23 are formed by conductive tracks made in metallization layers situated above and below those used to make the conductive tracks of the excitation coils.

In this embodiment, four compensation coils 26 to 29 are also wound respectively around the measurement coils 20 to 23 to cancel out the magnetic field in the bars, respectively 11, 8, 12 and 9. Thus, the measurement of the components $T_X$ and $T_Y$ is deduced from the intensity of the compensation current $i_{cH}$ which flows in these coils 26 to 29.

These coils 26 to 29 are formed by conductive tracks made in metallization layers situated above and below those used to form the conductive tracks of the measurement coils.

Because the work here is done in a zero magnetic field, this diminishes the magnetic coupling, between the measurements made along the directions X and Y, that could otherwise appear.

The printed circuit board 4 also has vertical coils to measure the component $T_Z$. The term "vertical coil" designates coils that get wound around and extend along a vertical axis. These coils are described in detail with reference to FIGS. 2 to 5. In FIG. 1, they are illustrated only very schematically.

More specifically, two holes 30 and 32 cross the printed circuit board 4 from one side to the other respectively along the vertical axes 34 and 36. These holes 30 and 32 are each designed to receive a respective arm of a vertical magnetic ring. To simplify the illustration, this vertical magnetic ring has not been shown in FIG. 1. FIG. 1 gives only a schematic view of the positioning of these holes 30, 32 relatively to the coils that surround them. The shaping of these holes is described in greater detail with reference to FIGS. 2 to 5.

Around these holes 30 and 32, the printed circuit board comprises two excitation coils 38 and 39 capable of generating a magnetic excitation field $_{Bexv}$ capable of saturating the vertical magnetic ring when they are crossed by an excitation current $_{iexv}$ with a frequency $_{fexv}$. For example, the current $_{iexv}$ and the frequency $_{fexv}$ are taken to be equal respectively to the current $_{iexH}$ and the frequency $_{fexH}$.

A vertical measurement coil 40 surrounds the two holes 30 and 32. This coil 40 is intended for measuring the magnetic field in the vertical magnetic ring.

Finally, a vertical compensation coil 42 is also made in the printed circuit board 4. This coil surrounds the holes 30 and 32. As here above, this coil has the function of cancelling the magnetic field in the vertical magnetic ring when it is crossed by a compensation current $i_{cv}$.

The turns of these coils 38, 39, 40 and 42 are formed by conductive tracks made in metallization layers of the printed circuit board 4. These conductive tracks are connected to one another by means of vertical vias to electrically connect the turns of a same coil to one another.

Finally, the sensor 2 has an electronic processing unit 50 capable of controlling the supply to the excitation and compensation coils and of processing the signals of the measurement coils to obtain a measurement of the magnetic field T. Typically, the measurement of each component of the magnetic field T is obtained from the amplitude of a harmonic of the excitation frequency in the voltage taken at the terminals of the measurement coils. The electrical connections between the unit 50 and the coils have not been shown in order to simplify the figure.

These coils 38, 39, 40 and 42 shall now be described in greater detail with reference to FIGS. 2 to 6.

The FIGS. 2 to 5 represent the conductive tracks made respectively in an upper metallization layer, in an even-order intermediate metallization layer, in an odd-order intermediate metallization layer, and in a lower metallization layer. The upper metallization layer contains the conductive tracks which form the upper end of the coils 38 to 40 and 42. The lower metallization layer contains the conductive tracks which form the lower ends of the coils 38 to 40 and 42.

The intermediate metallization layers are situated between the upper and lower metallization layers. They contain the conductive tracks which form the essential part of the turns of each coil. Here, the intermediate metallization layers are stacked on one another in alternating an even-order metallization layer and an odd-order metallization layer. The even-order metallization layers are all identical to one another so that only one of these even-order metallization layers shall be described. Similarly, the odd-order metallization layers are all identical to one another and only one these odd-order metallization layers shall be described in detail with reference to FIG. 4. The number of intermediate metallization layers is greater than two and preferably greater than four or eight.

Each of these metallization layers is crossed by the holes 30 and 32. The cross-section of these layers is identical in each metallization layer. Here, the holes 30 and 32 are oblong and extend along a same axis 52. The axis 52 is also an axis of symmetry for the holes 30, 32. The holes 30 and 32 are also symmetrical relatively to another axis 54 perpendicular to the axis 52. The axes 52 and 54 intersect at a point O. Here below in this description, the same references 50, 54 designate the same axes of symmetry whatever the metallization layer to which they belong.

In this embodiment, each coil 38, 39, 40 and 42 includes a downward coiling and an upward coiling. The use of a downward coiling and an upward coiling to form a same coil makes it possible to obtain connection pads to power this coil on a same face of the printed circuit board. Here, these connection pads are made on the upper face.

The downward coiling is wound around the hole or holes 30, 32 in descending from the upper face to the lower face. Inversely, the upward coiling is wound around the same holes in rising from the lower face to the upper face. The downward and upward coilings of a same coil are series-connected so that the current that crosses them always turns in the same sense around the hole or holes 30, 32.

Here below in this description, the term "connected" refers to an electrical connection.

The coils 38 and 29 are wound in opposite senses respectively around holes 30 and 32. The coils 40 and 42 get wound around the coils 38 and 39 and therefore around the holes 30 and 32. The coil 42 gets wound around the coil 40.

In these FIGS. 2 to 5, a circle situated at the end of a conductive track represents a descending via which connects this conductive track to a conductive track of a metallization layer just beneath it. Conversely, a solid dot situated at the end of a conductive track represents the end of a rising via which connects this conductive track to a conductive track of the metallization layer just above it. Thus, the circle corresponds to the upper end of a via while the dot corresponds to the lower end of this same via.

FIG. 2 represents connection pad 56 and 58 to power the coils 38 and 39. These pads are both situated on the axis 54 on either side of the axis 52.

The upper metallization layer also has connection pads 60 and 62 between which the measurement coil 40 generates a voltage representing the magnetic field present inside the vertical magnetic ring.

This upper metallization layer also has connection pads 64 and 66 to power the compensation coil 42.

The pad 56 is connected to a descending via 68 by a conductive track 70. The conductive track 70 gets wound in the clockwise sense in going from the exterior to the interior around the hole 30. Here, this track makes several full turns before reaching the via 68.

The pad 58 is connected to a descending via 72 by a conductive track 74. The conductive track 74 is the symmetric of the conductive track 70 by a central symmetry relatively to the point O.

The pads 60, 62, 64 and 66 are connected respectively to descending vias 78, 80, 82 and 84.

FIG. 3 shows an even-order metallization layer. In this metallization layer, the turns of the downward coilings of the coils 38 and 39 and are formed by means of a single conductive track 90. Similarly, the turns of the upward coilings of the coils 38 and 29 are formed by means of a single conductive track 92. The conductive track 90:
  gets wound around the hole 30 from an ascending via 94 in the clockwise sense going from the interior to the exterior, then
  gets wound around the hole 32 up to a descending via 96 in the counter-clockwise sense from the exterior to the interior.

The conductive track 92 extends, at a constant spacing or distance, along the conductive track 90. Thus, the conductive track 92:
  gets wound from a descending via 98 around the hole 30 in the clockwise sense in going from the interior to the exterior, and then
  gets wound around the hole 32 up to an ascending via 100 in the counter-clockwise sense in going from the exterior to the interior.

Here, the tracks 92 and 94 make several turns each around the holes 30 and 32.

In this metallization layer, the turns of the downward and upward coilings of the coil 50 are formed by only two conductive tracks, respectively 102 and 104. The track 102 gets wound from an ascending via 106 around conductive tracks 90 and 92 up to a descending via 108 in the counter-clockwise sense in going from the exterior to the interior. The track 104 gets wound from a descending via 110 around the tracks 90 and 92 up to an ascending via 112 in the counter-clockwise sense in going from the exterior to the interior. The tracks 102 and 104 make several full turns around the holes 30 and 32.

The turns of the downward and upward coilings of the coil 42 are formed by only two conductive tracks, respectively 114 and 116. The tracks 114 and 116 get wound around the tracks 102 and 104. More specifically, the track 114 gets wound from an ascending via 118 towards a descending via 120 in turning in the clockwise sense. The track 116 gets wound around the tracks 102 and 104 from an ascending via 124 to a descending via 122 in turning in the counter-clockwise sense. In this example, the tracks 114 and 116 each form only one half-turn in this metallization layer.

The vias 06, 108, 110, 112, 118, 120 and 124 are all aligned with the axis 54.

The conductive tracks of the upward and downward coilings of each coil in this metallization layer have a central symmetry relatively to the point O but no axial symmetry.

FIG. 4 shows the conductive tracks made in the odd-order metallization layer situated just beneath the metallization layer of FIG. 3. Consequently, the ends of the descending vias of the previous figure are seen again in this figure. These ends therefore carry the same references.

The turns of the downward and upward ceilings of the coils 38 and 29 are formed by only two conductive tracks 130 and 132. The conductive track 130 extends from the via 96 to a descending via 136. The track 132 extends from the via 98 towards a descending via 138.

The turns of the downward and upward ceilings of the coil 40 are formed by only two conductive tracks 140 and 142. The track 140 extends from the via 108 to a descending via 144. The track 142 extends from the via 110 to a descending via 146.

Finally, the turns of the downward and upward coilings of the coils 142 are formed by only two conductive tracks 150 and 152. The tracks 150 extends from the via 120 up to a descending via 154 and the track 152 extends from the via 122 up to a descending via 156.

The tracks 130, 132, 140, 142, 150 and 152 are deduced respectively from the tracks 92, 90, 104, 102, 116 and 114 by an axial symmetry relatively to the axis 52. The tracks 130, 132, 140, 142, 150 and 152 are also deduced respectively from the tracks 90, 92, 102, 104, 114 and 116 by an axial symmetry relatively to the axis 54. Thus, the structure of these tracks is not described herein in greater detail. It will also be noted that, as in the case of FIG. 3, the tracks of each coil have a central symmetry relatively to the point 0 but no axial symmetry.

The vias 108, 110, 120, 122, 144, 146, 154 and 156 are aligned with the axis 54.

FIG. 5 shows the lower metallization layer which comprises conductive tracks to connect the downward and upward coilings of each coil to one another. Here, the downward and upward coilings are connected to one another so that the current which crosses them turns in the same sense when they are powered. To simplify the description, it is assumed that this metallization layer is just beneath the odd-order metallization layer of FIG. 4. Consequently, this figure shows the lower ends of the descending vias described here above.

The coils 38 and 39 include a conductive track 160 which, starting from the via 136, gets wound around the hole 30 in the clockwise sense in going from the interior to the exterior, and then winds around the hole 32 up to the via 138 in the counter-clockwise sense from the exterior to the interior. This track 160 has a central symmetry relatively to the point O. The track 160 makes several full turns around the holes 30, 32.

A conductive track 162 connects the vias 144 and 146 of the measurement coils 40. A conductive track 164 connects the vias 154 and 156 of the compensation coil 42.

The tracks 90, 92 or 130, 132 of an intermediate metallization layer cannot in themselves show an axial symmetry because they get wound in opposite senses around the holes 30 and 32.

Nor can the set of two conductive tracks 102, 104 or the set of the two conductive tracks 140, 142 show any axial symmetry in an intermediate metallization layer. Indeed, the tracks of the downward and upward coilings are made in the same metallization layer, and this makes it necessary to offset them relatively to one another. This observation is also valid for the tracks: 90, 92; 130, 132; 114, 116 and 150, 152.

Now, one of the purposes of the coils designed is to increase their symmetry so as to improve the homogeneity of the magnetic fields along their respective winding axes and limit the biases observed relatively to ideal coils. To this end, the layout described herein of conductive tracks of each even-order and odd-order metallization layer reveals new axes of symmetry when these conductive tracks are superimposed in a horizontal plane. The superimposing of the even-order and odd-order metallization layers has been shown in FIG. 6. This superimposition reveals two axial symmetries, respectively, relatively to the axes 52 and 54. This reduces the bias relatively to the wire coilings and increases the homogeneity of the magnetic field along the winding axis. When the tracks of the even-order and odd-order metallization layer are superimposed, then only one of the tracks can be seen in FIG. 6.

Finally, in the particular case described here, the even-order metallization layer situated just beneath the upper metallization layer does not have any perfect axial symmetry when superimposed with an odd-order metallization layer. Indeed, in this even-order metallization layer, the vias 106, 112, 118 and 124 are slightly offset from the axis 54 to correspond to the ends of the vias, respectively 80, 78, 84 and 82. However, except for this even-order metallization layer, all the other intermediate even-order metallization layers have two perfect axial symmetries when superimposed with any one of the odd-order metallization layers.

FIGS. 7 and 8 show a coiled magnetic ring used in the sensor 2 to measure the component $T_z$. In these figures, the other parts of the sensor 2 have not been shown. More specifically, this coiled magnetic ring has a magnetic ring 170 housed in the holes 30 and 32 of the printed circuit board 4. FIG. 7 is an exploded view of the coiled magnetic ring while FIG. 8 is an assembled view of this same coiled magnetic ring. The magnetic ring 170 is formed by a U-shaped upper part 172 and a U-shaped lower part 174. The lower and upper parts each have two vertical arms, respectively 176, 178 and 180, 182 connected by a horizontal member, respectively 184 and 186, which form the base of the 'U's.

The parts 172 and 174 are cut out of a plate made of magnetic material, the static relative permeability of which is above 1000 and preferably above 10,000. For example, the magnetic material is a mu-metal or a magnetic metal known commercially as Vitrovac® 6025. Thus, their manufacture limits the mechanical stresses applied to the magnetic material. In particular, this prevents the folding of the magnetic material to form the U shape. The parts 172, 174 extend essentially in a vertical plane YZ passing through the axis 52. The width of each of these parts 172, 174 is in this vertical plane. The thickness of the parts 172 and 174 is perpendicular to this vertical plane. The thickness is typically less than 250 μm and preferably less than 100 μm or 25 μm.

The arms 176, 178 are introduced into the holes, respectively 30 and 32, from the upper face of the printed circuit board 4. Conversely, the arms 180 and 182 are introduced into the holes, respectively 30 and 32, from the lower face.

As illustrated in FIG. 3, in this particular case, the arms 176 and 180 are superimposed on top of one another in the direction X, within the hole 30, to provide magnetic continuity. For example, the arms 176 and 180 are superimposed on more than one-third of their vertical length. The arms 178, 182 are superimposed similarly within the hole 32.

The transverse dimensions of the arms are smaller by at least 5 μm and preferably at least 100 μm than the corresponding transverse dimensions of the holes to make a clearance between the vertical walls of the hole and the facing faces of the arms. More specifically, the transverse dimensions of the arms are chosen so that a clearance J greater than 5 μm appears between the thickest part of the magnetic ring 170 and the vertical walls of the hole. The thickest part of the ring 180 is the place where the arms are superimposed on top of one another in the direction X. Through the presence of this clearance, the magnetic ring 170 is not mechanically stressed, thus increasing the precision of the sensor 2.

Figure 10:
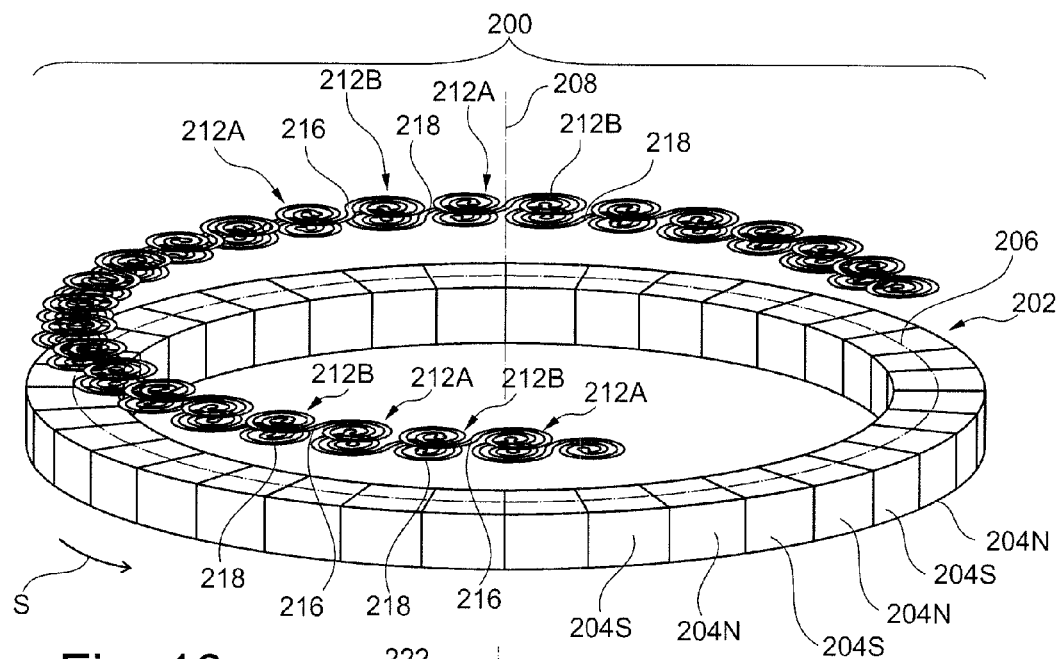
FIG. 10 is a schematic illustration in perspective of an alternating voltage generator.

FIG. 10 shows a generator 200 that generates an alternating voltage through the shifting of the magnetized ring 202. Here, only the elements needed to understand the invention are shown. Thus, for example, the elements that shift the magnetized or electronic control ring of this generator have not been shown.

The ring 202 includes a succession of magnets 204 of opposite polarity placed beside one another along a path 206. Here, the path 206 is a horizontal circle centered on a vertical rotation axis 208. The magnets, for which the North Pole is turned upwards, carry the reference 204N. The magnets for which the South Pole is turned upwards carry the reference 204S.

The magnets 204 are positioned along the entire path 206 in alternating magnets 204N and 204S. Here, one magnet 204S is introduced between every two magnets 204N. For example more than six magnets 204 are positioned along the path 206.

The generator also has a succession of coils 212 capable of converting the magnetic field generated by each magnet 204 into a voltage. These coils 212 are positioned for this purpose so as to be facing the succession of magnets 204. The coils 212 are positioned beside one another along the path 206. They are all identical except that they are wound sometimes in one sense and sometimes in the other sense around their respective vertical winding axis. The coils 212 wound in the clockwise sense starting, from the exterior towards the interior, are denoted as 212A. The coils 212 wound in the inverse sense are denoted as 212B. The coils 212A and 212B are positioned alternately along the path 206. Here, a coil 212B is situated between each coil 212A.

The transverse dimensions of the coils 212 are such that when a coil 212A is facing a magnet 204N, the immediately adjacent upstream and downstream coils 212B are respectively facing magnets 204S that are immediately upstream and downstream from this magnet 204N. Similarly, when the coil 212A is facing the magnet 204S, the immediately adjacent upstream and downstream coils 212B are respectively facing magnets 204N immediately upstream and downstream from this magnet 204S. The terms "downstream" and "upstream" are defined herein relatively to a direction S of rotation of the magnets 204, in relation to the coils 212, around the axis 208. Thus, when a coil 212 is facing a magnet 204, it is essentially sensitive to the magnetic flux of this magnet and not to the magnetic flux of the adjacent magnets.

Each coil is formed by conductive tracks of a multilayer printed circuit board 214, in this case two layers (FIG. 11) connected to one another by vertical vias. In FIG. 10, the printed circuit board 214 has not been shown to simplify this illustration.

Here, these conductive tracks are distributed between an upper metallization layer and a lower metallization layer.

To reduce the number of vertical vias used, the coils 212 are grouped in pairs. Each pair has a coil 211A and an immediately adjacent coil 212B in the direction S. In each pair, the coil 212B is upstream to the coil 212A.

In the upper metallization layer, the turns of the coils 212A and 212B of a same pair are formed by means of a single conductive track 216. The track 216:
  is wound around the winding axis of the coil 212B, from a descending via in the counter-clockwise sense from the interior towards the exterior, then
  is wound around the winding axis of the coil 212A in the clockwise sense from the exterior to the interior up to another ascending via.

Here, the track 216 makes several full turns around each winding axis. For example, the track 216 is identical to the track 90 described here above.

The turns of the coil 212B in the lower metallization layer are formed by a conductive track 218. The track 218 gets wound around the winding axis of the coil 212B in the clockwise sense from the exterior towards the interior, up to the lower end of the ascending via. The track 218 also gets wound around the winding axis of the coil 212A of the immediately upstream pair in the clockwise sense from the exterior to the interior.

The turns in the lower metallization layer of the coil 212A of this pair are formed by the conductive track 218 which also forms the turns of the coil 212B of the immediately downstream pair.

Thus, the track 218 forms, at the same time, the turns of the coils 212A and 212B of two adjacent pairs. It also connects the coils of these adjacent pairs in series so that the current which flows in the turns of one coil 212 always rotates in the same sense both in the upper metallization layer and in the lower metallization layer. This series connection enables the adding up of the voltages generated by each of the coils when they are facing a magnet 204. The track 218 is similar to the track 130 described here above but offset by an angular pitch. This angular pitch is equal to the angle between two successive vertical winding axes of the coils 212 and the center 208.

Figure 11:
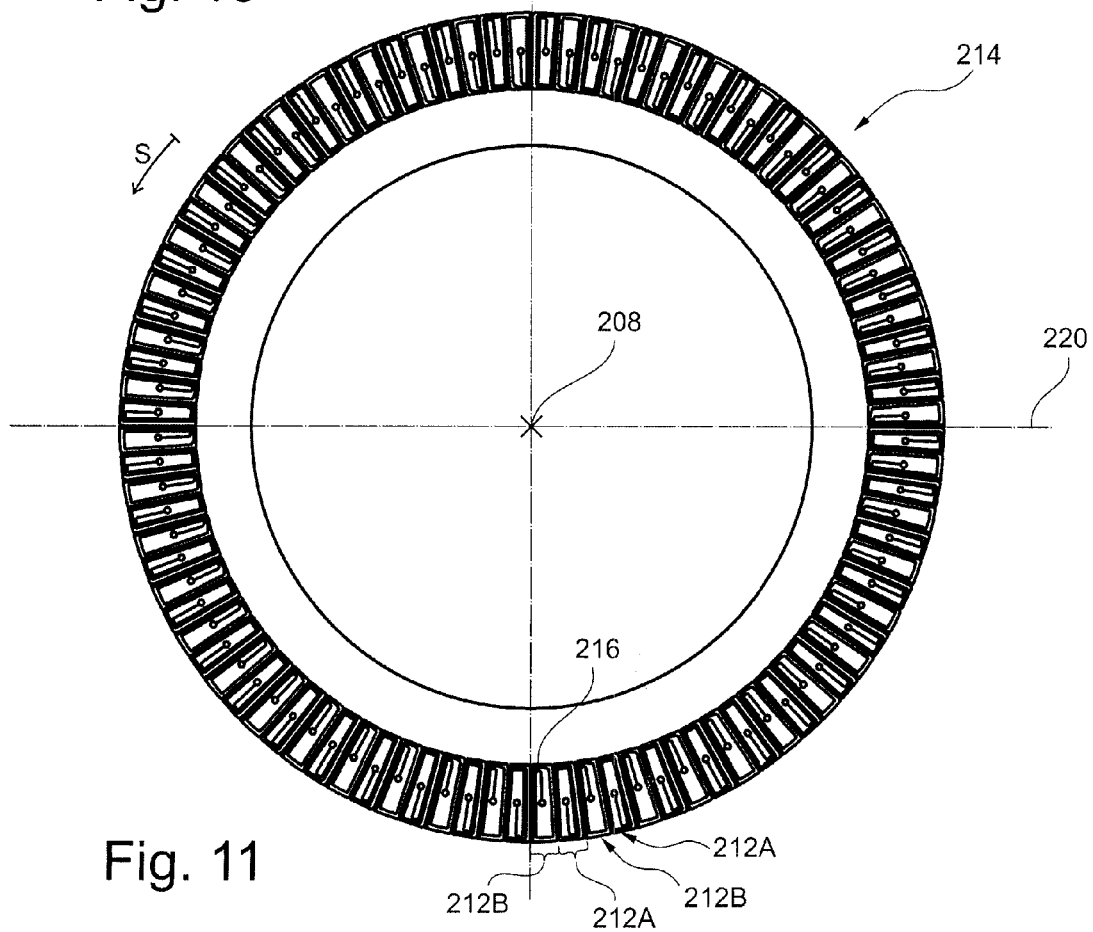
FIG. 11 is a illustration in a top view of the conductive tracks of a printed circuit board of the generator of FIG. 10.

FIG. 11 shows the upper metallization layer of the printed circuit board 214. In this figure, the upper ends of the vias are shown by circles. These upper ends are all aligned in a same circle centered on the axis 208. The conductive tracks 216 of the upper metallization layer have two axial symmetries relatively to the axes 220 and 222. The axes 220 and 222 are mutually orthogonal and contained in the plane of the upper metallization layer.

Furthermore, in this embodiment, the superimposing of the conductive tracks 216 and 218 in a horizontal plane creates a pattern that shows a symmetry of revolution. More specifically, this pattern is invariant in rotation by an angular pitch equal to the angular distance between two successive vertical winding axes of the coils 212.

During its operation, when the coil 212A of a pair of coils is facing a magnet 204N, it generates a voltage U. At the same time, the coil 212B of the same pair is facing a magnet 204S and therefore also generates a voltage U. The same phenomenon recurs in each pair of coils 212. Since these pairs of coils are series-connected, the voltages 2U generated by each pair get added up therefore so as to give a far greater voltage. When the magnetized ring 202 shifts relatively to the printed circuit board 214, the coil 212 which was previously facing the magnet 204N is now positioned so as to be facing the next magnet 204S. Thus, this coil 212A, like all the other coils, generates a voltage U. Thus, shifting the printed circuit board 214 rotationally in relation to the magnetized ring 202 causes an alternating voltage to be generated.

Many other embodiments are possible. For example, to increase the thickness of the printed circuit board, several printed circuit boards made as described here above can be stacked one on top of the other in the vertical direction. During this stacking, these printed circuit boards are connected together in preserving the sense of winding of the turns of each coil. Superimposing several multilayer printed circuit boards thus increases the length/width ratio of the magnetic rings as well as the number of turns of the sensor.

The conductive tracks can be etched in the metallization layer or deposited in this metallization layer.

In a simplified variant, a single excitation coil is used to generate the magnetic excitation field in the entire magnetic ring.

The conductive tracks which form the different coils can make only a half-turn around the holes 30 and 32 as illustrated in the case of the compensation coil 42. A half-turn is a single half turn around the winding axis. In another variant, the upward coilings are omitted.

The printed circuit board may also comprise intermediate metallization layers comprising conductive tracks which, when they are superimposed in a horizontal plane, do not show a pattern with two axial symmetries.

The layers described with reference to FIGS. 2 and 5 may be omitted. In this case, the electrical connections with the coils are made directly on the intermediate layers.

In each intermediate layer, the tracks 96 and 98 can be merged. We thus obtain a coiling that is only a downward coiling but with good symmetry.

As a variant, it is the superimposition of the conductive tracks having more than three metallization layers that shows a pattern with two axial symmetries.

It is not necessary that the metallization layers which get superimposed to form a pattern with axial symmetries should be metallization layers that immediately succeed one another in the stacking of metallization layers.

The vertical magnetic ring can be replaced by two parallel magnetic bars. Unlike the magnetic ring, these bars are magnetically isolated from each other by a big gap. In this case, the turns of the excitation coils are wound in the same sense, respectively around the axes 34 and 36 of these bars. In this configuration too, the conductive tracks of the even-order and odd-order metallization layers are laid out so that their superimposition in a horizontal plane reveals a pattern with two axial symmetries.

The specific winding of the excitation coils described here can also be implemented to make excitation coils wound and extending along horizontal and parallel winding axes. As described here above, this limits the number of vertical vias situated between the arms of a horizontal magnetic ring or between horizontal magnetic bars that are parallel and magnetically isolated with respect to one another.

The U-shaped part of the coiled magnetic core can be obtained by folding a strip or a wire. In this case, preferably, the strip or the wire is wound to form one or more turns passing through the holes 30 and 32.

Several U-shaped parts can be inserted within holes from the same face of the printed circuit board so as to increase the thickness of the magnetic ring in a horizontal direction.

The vertical arms 176, 178 can be housed within a rigid guide. For example, the guide is made out of a material or a combination of materials for which the Young's modulus at 25° C. is greater than 5 GPa and preferably greater than 50 GPa. The rigid guide facilitates the insertion of the vertical arms into the holes 30, 32. In this case, the clearance between the vertical arms and this guide corresponds to the clearance described here above between the vertical arms and the walls of the holes 30, 32. The guide also enables more efficient positioning of the magnetic elements. The guide typically has a U-shaped horizontal cross-section to receive each vertical arm.

As a variant, a dielectrical insulant is inserted between the arms of the U-shaped parts which get superimposed so as to isolate them electrically from one another. To this end, it is possible to cut out a U-shaped part from an electrically insulating material and then introduce this U-shaped insulating part between the lower and upper U-shaped parts 172 and 174. Another possibility consists in glazing or introducing a viscous liquid or glue onto the external surfaces of the parts 172 and 174 which overlap. Another solution is to treat the surface of the arms to make it electrically insulating. This treatment is known as "passivation".

The path along which the magnets and the turns 212 are positioned is not necessarily circular. For example, as a variant, it is rectilinear.

The turns of the lower metallization layer of the printed circuit board of the voltage generator are not necessarily identical to the turns made in the upper metallization layer. For example, the number of turns in the lower metallization layer can be smaller or greater than the number of turns in the upper metallization layer.

The printed circuit board 114 may comprise one or more metallization layers in which additional turns are formed.

The invention claimed is:

1. An apparatus comprising a printed circuit board, said printed circuit board comprising a stack, along a vertical direction, of several metallization layers mechanically separated from one another by electrically insulating layers, at least one first coil and one second coil series-connected to each other, said first and second coils being wound respectively around first and second vertical winding axes, each of said coils comprising turns formed by conductive tracks made in said metallization layers and electrically connected to one another by through-pads passing through at least one of said electrically insulating layers, wherein joining of said conductive tracks and said through-pads forms a conductive line that extends continuously from one end of said first coil to an opposite end of said second coil, wherein said at least one first coil and one second coil comprises a common first conductive track, made in a first metallization layer, wound around said first vertical winding axis and wound around said second vertical winding axis, and a common second conductive track, made in a second metallization layer, wound around said first vertical winding axis and wound around said second vertical winding axis, and a first pad passing through at least one of said insulating layers to electrically connect said common first conductive track and said common second conductive track to each other so that, when said first and second conductive tracks are powered, current always turns in the same sense around said first vertical winding axis and always in the same sense or in an opposite sense around said second vertical winding axis.

2. The apparatus of claim 1, wherein said first and second coils each comprise a downward coiling and an upward coiling, wherein said downward coiling is wound, in descending, around each of said vertical winding axes, turns of said downward coiling being formed by said first and second conductive tracks, and said upward coiling is wound, in ascending, around each of said vertical winding axes, turns of said upward coiling being formed by a third conductive track, made in said first metallization layer, wound around said first vertical winding axis and around said second vertical winding axis, and a fourth conductive track, made in said second metallization layer, wound around said first vertical winding axis and around said second vertical winding axis, wherein a second pad passes through at least one of said insulating layers to electrically connect said third conductive track and said fourth conductive track to each other, said downward and upward coilings being series connected so that current passing therethrough turns in the same sense both in said upward coiling and in said downward coiling.

3. The apparatus of claim 1, wherein said conductive tracks of said first and second coils are laid out, in said first and second metallization layers immediately consecutively along said vertical direction, so that a superimposition of said conductive tracks in a plane parallel to said layers forms a pattern with two axial symmetries relative to first and second coordinate axes, said first and second coordinate axes being orthogonal to each other and parallel to said metallization layers, said conductive track or tracks of each of said superimposed metallization layers being devoid, in themselves, of axial symmetry relative to said first and second coordinate axes.

4. The apparatus of claim 3, wherein said stack of several metallization layers comprises an upper metallization layer, a lower metallization layer and, between said upper and lower metallization layers, a first cardinality of intermediate metallization layers, where said first cardinality is a natural integer strictly greater than or equal to two, and wherein more than second cardinality of pairs of two intermediate metallization layers are immediately stacked on one another, for which the superimposition of conductive tracks of first and second coils, made in said metallization layers of said pair, forms a pattern with two axial symmetries relative to said first and second coordinate axes, wherein said second cardinality is two less than said first cardinality.

5. The apparatus of claim 3, wherein, in said superimposition, said first and third conductive tracks are symmetric to said second and fourth conductive tracks relative to said first coordinate axis and to said second coordinate axis.

6. The apparatus of claim 1, wherein said conductive tracks of said first metallization layer have a central symmetry around a first center and said conductive tracks of said second metallization layer have a central symmetry around a second center, said first and second centers being superimposed on one another along said vertical direction.

7. The apparatus of claim 1, wherein each conductive track is wound in one sense around said first vertical winding axis and in an opposite sense around said second vertical winding axis.

8. An apparatus comprising a magnetic field sensor, said magnetic field sensor comprising a magnetic core comprising two parallel arms, at least two coils each wound around a respective arm of said magnetic core, and a printed circuit board, said printed circuit board comprising a stack, along a vertical direction, of several metallization layers mechanically separated from one another by electrically insulating layers, at least one first coil and one second coil series-connected to each other, said first and second coils being wound respectively around first and second vertical winding axes, each of said coils comprising turns formed by conductive tracks made in said metallization layers and electrically connected to one another by through-pads passing through at least one of said electrically insulating layers, wherein joining of said conductive tracks and said through-pads forms a conductive line that extends continuously from one end of said first coil to an opposite end of said second coil, wherein said at least one first coil and one second coil comprises a common first conductive track, made in a first metallization layer, wound around said first vertical winding axis and wound around said second vertical winding axis, and a common second conductive track, made in a second metallization layer, wound around said first vertical winding axis and wound around said second vertical winding axis, and a first pad passing through at least one of said insulating layers to electrically connect said common first conductive track and said common second conductive track to each other so that, when said first and second conductive tracks are powered, current always turns in the same sense around said first vertical winding axis and always in the same sense or in an opposite sense around said second vertical winding axis, wherein said at least one first coil and one second coil of said printed circuit board form two coils of said magnetic field sensor.

9. An apparatus comprising an alternating voltage generator, said alternating voltage generator comprising a succession of magnets of opposite polarity, said magnets being placed beside one another in alternating polarities along a path of movement, a succession of coils facing said succession of magnets, said coils being positioned beside one another along said path of movement in alternating winding senses, each coil being sized so as to be sensitive to a magnetic field of a single magnet when said magnet faces said coil, said succession of coils being movable along a direction of movement relative to said succession of magnets along said path of movement to generate an alternating voltage, and a printed circuit comprising at least one metallization layer, wherein said coils are grouped together in immediately adjacent pairs of coils along said direction of movement, wherein first and second coils of a pair of coils are formed by a common conductive track wound in one sense around a first winding axis of said first coil and wound in an opposite sense around a second winding axis of said second coil, said track being made in a first metallization layer of said printed circuit, wherein said first coil is formed by a second conductive track made in another metallization layer of said printed circuit, said second conductive track being wound in the same sense as the first conductive track around said first winding axis and being wound in an opposite sense around said winding axis of said second coil of said pair of coils immediately adjacent upstream, and wherein said second coil is formed by a third conductive track made in another metallization layer of said printed circuit, said third conductive track being wound in the same sense as said first conductive track around said second winding axis and wound in an opposite sense around said winding axis of said first coil of said pair of coils immediately adjacent downstream, upstream and downstream being defined relative to said direction of movement.

* * * * *